(12) United States Patent
Kojima et al.

(10) Patent No.: US 8,492,070 B2
(45) Date of Patent: Jul. 23, 2013

(54) PHOTOCURABLE AND THERMOSETTING RESIN COMPOSITION AND PRINTED CIRCUIT BOARDS MADE BY USING THE SAME

(75) Inventors: Hideaki Kojima, Kawagoe (JP); Hidekazu Miyabe, Hiki-gun (JP); Shouji Minegishi, Iruma (JP); Naoki Yoneda, Kawagoe (JP); Yoshitaka Hirai, Higashimatsuyama (JP)

(73) Assignee: Taiyo Ink Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/560,286

(22) Filed: Jul. 27, 2012

(65) Prior Publication Data

US 2012/0295200 A1    Nov. 22, 2012

Related U.S. Application Data

(60) Continuation of application No. 12/153,309, filed on May 16, 2008, now abandoned, which is a division of application No. 11/137,641, filed on May 26, 2005, now abandoned, and a continuation of application No. PCT/JP03/15187, filed on Nov. 27, 2003.

(30) Foreign Application Priority Data

Nov. 28, 2002   (JP) ................................ 2002-346254

(51) Int. Cl.
  *G03F 7/00*   (2006.01)
  *G03F 7/004*  (2006.01)
  *G03F 7/028*  (2006.01)
  *G03F 7/027*  (2006.01)
  *C07C 291/00* (2006.01)

(52) U.S. Cl.
  USPC ..... 430/270.1; 430/905; 430/913; 430/281.1; 430/286.1; 564/254

(58) Field of Classification Search
  USPC .. 430/270.1, 905, 913, 281.1, 286.1; 564/254
  See application file for complete search history.

(56) References Cited

U.S. PATENT DOCUMENTS

| | | | |
|---|---|---|---|
| 4,388,426 A | 6/1983 | Schure et al. | |
| 4,943,516 A | 7/1990 | Kamayachi et al. | |
| 6,316,528 B1 | 11/2001 | Iida et al. | |
| 6,342,322 B1 | 1/2002 | Kakinuma et al. | |
| 6,949,678 B2 | 9/2005 | Kunimoto et al. | |
| 2008/0227883 A1* | 9/2008 | Kojima et al. | 522/18 |

FOREIGN PATENT DOCUMENTS

| | | |
|---|---|---|
| EP | 1 266 922 A1 | 12/2002 |
| GB | 2 357 293 A | 6/2001 |
| JP | 60-166306 U | 8/1985 |
| JP | 01-141904 | 6/1989 |
| JP | 2002-090994 | 3/2002 |
| JP | 2002-293877 | 10/2002 |
| JP | 2002-296771 | 10/2002 |
| WO | WO-01/58977 A1 | 8/2001 |

OTHER PUBLICATIONS

International Search Report of Mar. 2, 2004 from PCT/JP03/15187.
Communication from European Patent Office dated Apr. 22, 2008 for application No. 03775937.0-2102.

\* cited by examiner

*Primary Examiner* — Amanda C. Walke
(74) *Attorney, Agent, or Firm* — Rader, Fishman & Grauer PLLC

(57) ABSTRACT

A photocurable and thermosetting composition comprises (A) a carboxyl group-containing resin having at least one carboxyl group in its molecule, (B) a photopolymerization initiator having an oxime linkage represented by the following general formula (I), (C) a reactive diluent, and (D) an epoxy compound having two or more epoxy groups in its molecule. The above-mentioned photopolymerization initiator (B) is incorporated into a formulation which is different from at least a formulation into which the above-mentioned carboxyl group-containing resin (A) and the above-mentioned reactive diluent (C) are incorporated to formulate a system comprising at least two parts.

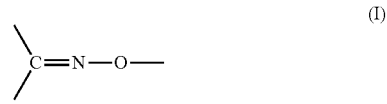

(I)

24 Claims, No Drawings

PHOTOCURABLE AND THERMOSETTING RESIN COMPOSITION AND PRINTED CIRCUIT BOARDS MADE BY USING THE SAME

CROSS-REFERENCE TO RELATED APPLICATIONS

This application is a Continuation of application Ser. No.: 12/153,309, filed May 16, 2008, which is a Divisional of application Ser. No. 11/137,641, filed on May 26, 2005, which is a National Stage of PCT/JP03/15187, filed Nov. 27, 2003, which in turn claims priority from Japanese Application No.: 2002-246254, filed Nov. 28, 2002, the entire contents of which are incorporated herein by reference.

BACKGROUND OF THE INVENTION

1. Field of the Invention

This invention relates to a photocurable and thermosetting resin composition and a printed circuit board made by using the same, and more particularly relates to a photocurable and thermosetting resin composition which excels in tack-free dryness, adhesiveness, and resolving properties, scarcely produces mist during the thermal curing thereof, enjoys high sensitivity, and excels in storage stability, and to a printed circuit board having a solder resist layer and/or a resin insulating layer excelling in resistance to PCT (pressure cooker test), electrical insulating properties, etc., which are produced by using the composition mentioned above and which reduce the generation of gas during the mounting of the parts thereon.

2. Description of the Prior Art

A solder resist composition is used for the purpose of preventing the bridging of solder and protecting circuits during the soldering of a given part to a printed circuit board. The cured product thereof is, therefore, required to possess such properties as adhesiveness, resistance to chemicals, and electrical properties. In recent years, the demand for the production of printed circuit boards of further decreased weight and increased density of conductor circuits has been finding growing recognition in the printed circuit board manufacture industry. To cope with this demand, a photolithographic developing type solder resist composition, particularly the composition which can be developed with an aqueous alkaline solution has been developed and employed (see JP 1-141904, A, for example).

However, in the case of the solder resist composition which has been heretofore used, since the photo-curing of the depths of a coating film at the time of exposure is inadequate in the image formation, the coating film may exfoliate during the development thereof, which forms a big factor of preventing formation of the image with high resolving properties. Therefore, the fully satisfied material is not found out till now, though the demand for development of the solder resist composition excelling in the curing properties in deep portions at the time of exposure increases.

The formation of a solder resist layer using such a photolithographic developing type composition requires a step of applying a resist composition to the entire surface of a substrate by a screen printing method, a curtain coating method, a spray coating method, a roll coating method, etc., a preliminary drying step for volatilizing an organic solvent in order to allow the contact exposure, an exposure step for cooling the coating film and subjecting it to the contact exposure, a developing step to remove unexposed portions by development, and a thermal curing step for obtaining the sufficient coating properties. Among these steps, particularly the exposure step is the very cumbersome process which comprises exchanging a negative film according to the kind of the printed circuit board, carrying out the position alignment thereof, then drawing a vacuum and subjecting it to exposure to light. Therefore, the shortening of the exposure process becomes a significant factor for improving the productivity and lowering the cost. The high sensitivity of the solder resist composition greatly contributes to the shortening of an exposure process. Under such circumstances, as for the solder resist composition used for a general-purpose electric device, the demand for high sensitivity is increasing. In order to realize such demand for increasing the sensitivity, it is generally considered to add a large amount of a polyfunctional (meth)acrylate compound to the composition. However, if the polyfunctional (meth)acrylate compound of a low molecular weight is added to the composition in a large amount, though the sensitivity will be improved, there is a problem that tack-free dryness (tack-free properties) required for the contact exposure decreases remarkably, and the properties of the cured coating film also decrease.

Furthermore, in the formation of a solder resist layer using such a photolithographic developing type solder resist composition, a volatile component (mist) generated from a resist composition adheres to a hot air circulation type drying oven or to an exposure device in a preliminary drying process accompanied with heating, an exposure process, a thermal curing process, and a soldering process, which becomes the cause of the abnormalities in mounting the parts in the following soldering process and a subsequent gold plating process. Therefore, the demand for the development of a solder resist composition which contains a small amount of ingredients (mist) which volatilizes from the resist composition in the preliminary drying process, the exposure process, the thermal curing process, and the soldering process has been finding growing recognition, but the material which may fully satisfy such a demand is not found out till now.

On the other hand, as a method for the production of a multi-layer printed circuit board, a lamination pressing method has been heretofore known to the art. The lamination pressing method, however, necessitates use of production facilities which are very voluminous and highly expensive and incurs difficulty in forming fine patterns because the plating is carried out on the outer layer during the plating step of through-holes and the thickness of copper deposit increases. For the purpose of overcoming such problems, in recent years strenuous efforts are being continued for the development of a multi-layer printed circuit board having conductor layers and resin insulating layers alternately build up (build-up technique).

One method of such a build-up technique is, for example, a method of manufacturing a multi-layer printed circuit board which forms a resin insulating layer by using a photolithographic developing type composition. This method comprises firstly applying a liquid photosensitive resin composition to the entire surface of a circuit board having conductor circuits formed in advance thereon so that the conductor circuits are buried in the resultant coating film by an arbitrary method such as a screen printing method, a curtain coating method, and a spray coating method, drying the coating film, then superposing a negative film having a prescribed exposure pattern on the dried coating film, irradiating the dried coating film with ultraviolet light for exposure, then removing the negative film from the coating film, subjecting the coating film to a development treatment to form a cured resin insulating layer of the prescribed pattern, subsequently treating the resin insulating layer with a coarsening agent thereby imparting coarsened surface thereto, and thereafter forming a conductor layer as by electroless plating or electroplating.

In such a method of manufacturing the multi-layer printed circuit board having conductor layers and resin insulating layers alternately build up, the photosensitive resin composition to be used is required to exhibit sufficient photo-curing of the depths of a coating film at the time of exposure, and the interlaminar resin insulating layer formed therefrom is required to be excellent in such properties as adhesiveness to a conductor layer, electrical insulating properties, heat resistance, and resistance to chemicals. Further, in the heating step performed after formation of a conductor layer as by electroless plating or electroplating, the volatile component generated from the interlaminar resin insulating layer becomes the cause of inferior adhesiveness of the conductor layer thereto. However, the material which may fully solving such problems is not found out till now.

As for the manufacture of a printed circuit board which is used in the devices of small-amount production such as analytical instrument and a printed circuit board to be manufactured as a trial, the demand is directed to a solder resist composition which can cope with a direct imaging technique which directly forms an image on a printed circuit board according to the CAD (computer aided design) data from a computer. As a light source to be used in such a direct imaging technique, a laser source is preponderantly used. The ultraviolet light of 300-450 nm in wavelength is used as a single wavelength or in combination of several wavelengths, the beam diameter is in the range of 5-15 µm, and the output is about several watts. Since the image is formed by scanning with a width of 5-15 µm while repeating ON-OFF of such a laser beam, the period for forming a resist pattern on one printed circuit board greatly depends on the sensitivity of the solder resist composition. Accordingly, the solder resist composition to be used in the laser direct imaging technique is required to possess the sensitivity higher than that of the developing type solder resist composition to be subjected to the general contact exposure.

SUMMARY OF THE INVENTION

The present invention has been made under the aforementioned background and its main object is to provide a photocurable and thermosetting resin composition which can be developed with an aqueous alkaline solution, exhibits sufficiently high curing properties in deep portions of a coating film at the time of exposure, enjoys high degree of resolution, gives a cured product which excels in such properties as heat resistance, resistance to chemicals, electrical properties, resistance to moisture absorption, and PCT resistance, and contains a small amount of a component (mist) which volatilizes from a solder resist composition in a preliminary drying process accompanied with heating, an exposure process, a thermal curing process, and a soldering process.

Another object of the present invention is to provide a photocurable and thermosetting resin composition which exhibits high sensitivity, enjoys high workability, is capable of coping with a solder resist to be used in the laser direct imaging technique, and excels in storage stability.

A further object of the present invention is to provide a printed circuit board having a solder resist layer and/or a resin insulating layer formed thereon, which layers allow reduction of gas which generates during the mounting of the parts thereon and excel in PCT resistance, electrical insulating properties, etc.

To accomplish the objects mentioned above, the present invention provides a photocurable and thermosetting resin composition characterized by comprising (A) a carboxyl group-containing resin having at least one carboxyl group in its molecule, (B) a photopolymerization initiator having an oxime linkage represented by the following general formula (I), (C) a reactive diluent, and (D) an epoxy compound having two or more epoxy groups in its molecule, wherein the photopolymerization initiator (B) mentioned above is incorporated into a formulation which is different from at least a formulation into which the above-mentioned carboxyl group-containing resin (A) and the above-mentioned reactive diluent (C) are incorporated to formulate a system comprising at least two parts.

(I)

In accordance with the present invention, there is further provided a printed circuit board having a solder resist layer and/or a resin insulating layer formed thereon by the use of the photocurable and thermosetting resin composition mentioned above.

Since the photocurable and thermosetting resin composition according to the present invention uses the photopolymerization initiator having an oxime linkage as a photopolymerization initiator, it exhibits high sensitivity and high curing properties in deep portions of a coating film and is capable of stably forming a cured film which excels in such properties as heat resistance and PCT resistance. Further, since the composition exhibits high sensitivity, it enjoys high workability, allows preparation at a low cost, and is capable of coping with the laser direct imaging technique. By incorporating the photopolymerization initiator having the oxime linkage which exhibits high sensitivity into a formulation separated from a formulation into which a carboxyl group-containing photosensitive resin and a reactive diluent having at least one unsaturated double bond in its molecule are incorporated, it will be easy to prepare a composition using the oxime-based photopolymerization initiator which generates radicals by the irradiation of visible light. Further, by incorporating the photopolymerization initiator having the oxime linkage into a formulation separated from a formulation into which the carboxyl group-containing resin is incorporated, the oxime-based photopolymerization initiator is prevented from being deteriorated, thereby providing the stable photocurable and thermosetting resin composition. Moreover, there is obtained another effect of reducing the contamination of the working environment because any mist originated from a photopolymerization initiator will not generate in an exposure process, a thermal curing process accompanied with heating, and a soldering process.

DETAILED DESCRIPTION OF THE PREFERRED EMBODIMENTS

The present inventors, after continuing a diligent study for solving the problems mentioned above, have made the findings that the composition containing at least one photopolymerization initiator having the oxime linkage represented by the aforementioned general formula (I) as a photopolymerization initiator (B) in combination with (A) a carboxyl group-containing resin having at least one carboxyl group in its molecule, (C) a reactive diluent, and (D) an epoxy compound having two or more epoxy groups in its molecule highly sensitively reacts with the active energy ray irradiated during the exposure process, that the photopolymerization rate of the photosensitive components (a carboxyl group-containing resin having two or more photosensitive unsaturated double bonds in its molecule and a reactive diluent) increases and, as a result, the resolving properties are improved, that a coating film which excels in tack-free dryness may be obtained, and that the generation of components (mist) which volatilizes during the thermal curing process is little.

Specifically, since the photopolymerization initiator (B) having the oxime linkage represented by the aforementioned general formula (I) to be used in the present invention exhibits high sensitivity, thereby giving the sufficient resolving properties with the addition of a small amount thereof, does not give the cause of generation of mist because it does not vapor out by heating, and contributes to the preparation of a coating film which excels in tack-free dryness because it sparingly dissolves in a solvent.

It has been now confirmed, however, that a composition containing the photopolymerization initiator (B) having the oxime linkage represented by the aforementioned general formula (I) incorporated therein together with the aforementioned carboxyl group-containing resin (A) having at least one carboxyl group in its molecule exhibits poor storage stability because the photopolymerization initiator has a pair of unpaired electrons in its nitrogen atom. Further, since the photopolymerization initiator (B) having the oxime linkage represented by the aforementioned general formula (I) exhibits high sensitivity, the contact thereof with the reactive diluent (C) is not preferable in view of the storage stability.

After due consideration of the above findings, the present inventors have found that the photocurable and thermosetting resin composition which enjoys high storage stability may be obtained by incorporating the photopolymerization initiator (B) having the oxime linkage mentioned above into a formulation which is different from at least a formulation into which the above-mentioned carboxyl group-containing resin (A) and the above-mentioned reactive diluent (C) are incorporated to formulate a system comprising at least two parts. As a result, the present invention has been perfected.

Incidentally, in this specification the photopolymerization initiator having the oxime linkage represented by the aforementioned general formula (I) may be occasionally referred to as the oxime-based photopolymerization initiator.

Now, the components of the alkali-developing type photocurable and thermosetting resin composition of the present invention will be described in detail below.

First, as the above-mentioned carboxyl group-containing resin (A) having at least one carboxyl group in its molecule, any of the carboxyl group-containing resins, specifically any of the carboxyl group-containing photosensitive resins having an ethylenically unsaturated double bond in itself and any of the carboxyl group-containing resins having no ethylenically unsaturated double bond may be used and not limited to particular resins. However, the resins (either of oligomer and polymer may be adopted) as listed below can be particularly advantageously used:

(1) a carboxyl group-containing resin obtained by the copolymerization of (a) an unsaturated carboxylic acid with (b) a compound having an unsaturated double bond, (2) a carboxyl group-containing photosensitive resin obtained by adding an ethylenically unsaturated group (b') as a pendant to a copolymer of (a) an unsaturated carboxylic acid and (b) a compound having an unsaturated double bond, (3) a carboxyl group-containing photosensitive resin obtained by causing (d) an unsaturated monocarboxylic acid to react with a copolymer of (c) a compound having a epoxy group and an unsaturated double bond and (b) a compound having an unsaturated double bond and then causing (e) a saturated or unsaturated polybasic acid anhydride to react with the secondary hydroxyl group caused by the above reaction, (4) a carboxyl group-containing photosensitive resin obtained by causing (g) a compound having a hydroxyl group and an unsaturated double bond to react with a copolymer of (f) an acid anhydride having an unsaturated double bond and (b) a compound having an unsaturated double bond, (5) a carboxyl group-containing photosensitive resin obtained by causing (h) a polyfunctional epoxy compound to react with (d) an unsaturated monocarboxylic acid and then causing (e) a saturated or unsaturated polybasic acid anhydride to react with the hydroxyl group caused by the above reaction, (6) a hydroxyl group-containing and carboxyl group-containing photosensitive resin obtained by causing (e) a saturated or unsaturated polybasic acid anhydride to react with (i) a hydroxyl group-containing polymer and then further causing (c) a compound having an epoxy group and an unsaturated double bond to react with the resultant carboxylic acid, (7) a carboxyl group-containing photosensitive resin obtained by causing (e) a saturated or unsaturated polybasic acid anhydride to react with a reaction product of (h) a polyfunctional epoxy compound with (d) an unsaturated monocarboxylic acid and (j) a compound containing in its molecule at least one alcoholic hydroxyl group and one reactive group other than the alcoholic hydroxyl group, which can react with an epoxy group, and (8) a carboxyl group-containing photosensitive resin obtained by causing (d) an unsaturated monocarboxylic acid to react with (l) a polyfunctional oxetane compound having at least two oxetane rings in its molecule and then causing (e) a saturated or unsaturated polybasic acid anhydride to react with the primary hydroxyl group of the resultant modified oxetane resin.

Among other resins enumerated above, the carboxyl group-containing photosensitive resins having two or more photosensitive unsaturated double bond in its molecule, particularly the carboxyl group-containing photosensitive resin (5) mentioned above, prove to be desirable.

Since the carboxyl group-containing resins (A) mentioned above have numerous free carboxyl groups added to the side chain of a backbone polymer, the composition containing these resins is developable with a dilute aqueous alkaline solution.

The acid value of the carboxyl group-containing resin (A) mentioned above is preferred to be in the range of 45 to 200 mg KOH/g, preferably in the range of 45 to 160 mg KOH/g. If the acid value of the carboxyl group-containing resin is less than 45 mg KOH/g, the development of the composition with an aqueous alkaline solution will be performed only with difficulty. Conversely, if the acid value exceeds 200 mg KOH/g, the dissolving out of the exposed area in a developing solution will proceed, the line width will become narrow unduly, occasionally a coating film is dissolved out in a developing solution and separated from a substrate regardless of the exposed area or unexposed area and, as a result, the formation of a proper resist pattern may be attained only with difficulty.

The carboxyl group-containing resin (1) mentioned above is obtained by the copolymerization of (a) an unsaturated carboxylic acid and (b) a compound having an unsaturated double bond and is soluble in an aqueous alkaline solution because it contains the carboxyl groups.

As concrete examples of the unsaturated carboxylic acid (a) mentioned above, acrylic acid, methacrylic acid, itaconic acid, crotonic acid, maleic acid, fumaric acid, vinylacetic acid, or anhydrides of these acids; and the reaction product of such an acid hydride as maleic anhydride, itaconic anhydride, or pyromellitic anhydride with such a hydroxyl group-containing unsaturated compound as 2-hydroxyethyl (meth) acrylate or 2-hydroxypropyl (meth)acrylate, and other similar hydroxyalkyl (meth)acrylates may be cited. These unsaturated carboxylic acids may be used either singly or in the form of a combination of two or more members. Among other unsaturated carboxylic acids mentioned above, acrylic acid and/or methacrylic acid prove to be desirable. Incidentally, the term "(meth)acrylate" as used in the present specification refers collectively to acrylate and methacrylate. This holds good for other similar expression.

As concrete examples of the aforementioned compound (b) having an unsaturated double bond, styrene, chlorostyrene, and α-methylstyrene; (meth)acrylates possessing methyl, ethyl, n-propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, butoxyethyl, 2-hydroxyethyl, 2-hydroxypropyl, 3-chloro-2-hydroxypropyl, etc. as substituent(s); mono(meth)acrylates of polyethylene glycol and mono(meth)acrylates of polypropylene glycol; vinyl acetate, vinyl butyrate, and vinyl benzoate; and acrylamide, methacrylamide, N-hydroxy methyl acrylamide, N-hydroxymethyl methacrylamide, N-methoxymethyl acrylamide, N-ethoxymethyl acrylamide, N-butoxymethyl acrylamide, acrylonitrile, vinyl ethers, isobutylene, etc. may be cited. These compounds may be used either singly or in the form of a combination of two or more members. Among other compounds mentioned above, styrene, α-methylstyrene, lower alkyl (meth)acrylates, and isobutylene are advantageously used.

The carboxyl group-containing photosensitive resin (2) mentioned above is a resin obtained by adding an ethylenically unsaturated group (b') as a pendant to part of the carboxyl groups of the copolymer of the above-mentioned unsaturated carboxylic acid (a) and the unsaturated double bond-containing compound (b) mentioned above, thereby inducing introduction of the photosensitive ethylenically unsaturated group into the side chain of the copolymer. Since the copolymer keeps part of the carboxyl groups contained therein in the unreacted form, the carboxyl group-containing photosensitive resin to be obtained is soluble in an aqueous alkaline solution. The film which is formed of the photosensitive resin composition containing such a resin, therefore, permits stable development with an aqueous alkaline solution after the selective exposure to light.

As the aforementioned ethylenically unsaturated group (b') to be added as a pendant, vinyl group, allyl group, acryloyl group, and methacryloyl group may be cited. As a method of adding such an ethylenically unsaturated group to the copolymer mentioned above, the method of adding an ethylenically unsaturated compound having an epoxy group or (meth) acrylic chloride to the carboxylic group of the copolymer may be adopted.

As the ethylenically unsaturated compound having an epoxy group or (meth)acrylic chloride used herein, glycidyl (meth)acrylate, allyl glycidyl ether, β-methylglycidyl (meth) acrylate, chrotonic acid glycidyl ether, 3,4-epoxycyclohexylmethyl (meth)acrylate, (meth)acrylic chloride, chrotonic chloride, etc. may be cited. Among other compounds mentioned above, glycidyl (meth)acrylate proves to be desirable.

The carboxyl group-containing photosensitive resin (3) mentioned above is a resin obtained by causing the carboxyl group of (d) an unsaturated monocarboxylic acid to react with the epoxy group of a copolymer of (c) a compound containing an epoxy group and an unsaturated double bond in its molecule and (b) the unsaturated double bond-containing compound mentioned above, at such a ratio as to improve the photo-curing properties until a sufficient photo-curing depth is obtained, thereby inducing introduction of the unsaturated double bond of the above-mentioned unsaturated monocarboxylic acid into the side chain of the copolymer, and further causing the esterification reaction of the resultant secondary hydroxyl group caused by the above addition reaction with (e) a saturated or unsaturated polybasic acid anhydride, thereby inducing introduction of the carboxylic group into the side chain of the resin.

As concrete examples of the aforementioned compound (c) containing an epoxy group and an unsaturated double bond in its molecule, glycidyl (meth)acrylate, β-methylglycidyl (meth)acrylate, 3,4-epoxycyclohexylmethyl (meth)acrylate, etc. may be cited. These compounds may be used either singly or in the form of a combination of two or more members.

As concrete examples of the unsaturated monocarboxylic acid (d) mentioned above, acrylic acid, methacrylic acid, crotonic acid, cinnamic acid, α-cyanocinnamic acid, β-styryl acrylic acid, β-furfuryl acrylic acid, etc. may be cited. These unsaturated monocarboxylic acids may be used either singly or in the form of a combination of two or more members.

As concrete examples of the saturated or unsaturated polybasic acid anhydride (e), succinic anhydride, maleic anhydride, phthalic anhydride, tetrahydrophthalic anhydride, hexahydrophthalic anhydride, methylhexahydrophthalic anhydride, itaconic anhydride, methylendomethylenetetrahydrophthalic anhydride, trimellitic anhydride, pyromellitic anhydride, etc. may be cited. These polybasic acid anhydrides may be used either singly or in the form of a combination of two or more members.

The carboxyl group-containing photosensitive resin (4) mentioned above is a resin obtained by causing the acid anhydride group of a copolymer of an unsaturated double bond-containing acid anhydride (f) and the unsaturated double bond-containing compound (b) mentioned above to react with the hydroxyl group of a compound (g) having a hydroxyl group and an unsaturated double bond to produce a half ester, thereby inducing introduction of the unsaturated double bond of the compound (g) mentioned above into the side chain of the resin.

As concrete examples of the unsaturated double bond-containing acid anhydride (f) mentioned above, maleic anhydride, itaconic anhydride, a partial reaction product of pyromellitic anhydride with a hydroxyl group-containing unsaturated compound such as a hydroxyalkyl (meth)acrylate like 2-hydroxyethyl (meth)acrylate and 2-hydroxypropyl (meth)acrylate, etc. may be cited. These acid anhydrides may be used either singly or in the form of a combination of two or more members. Among other acid anhydrides cited above, maleic anhydride is particularly desirable from the viewpoint of stable synthesis of the polymer.

As concrete examples of the compound (g) having a hydroxyl group and an unsaturated double bond, hydroxyalkyl (meth)acrylates such as 2-hydroxyethyl (meth)acrylate and 2-hydroxypropyl (meth)acrylate; a hydroxyethyl (meth) acrylate modified with lactone, etc. may be cited. These compounds may be used either singly or in the form of a combination of two or more members.

The carboxyl group-containing photosensitive resins (2)-(4) mentioned above excel in photo-curing properties and contribute to the tack-free dryness of the composition.

The carboxyl group-containing photosensitive resin (5) mentioned above is a resin obtained by causing the carboxyl group of (d) the aforementioned unsaturated monocarboxylic acid to react with the epoxy group of (h) a polyfunctional epoxy compound to produce an epoxy acrylate and further causing the esterification reaction of the resultant secondary hydroxyl group caused by the above addition reaction with (e) the saturated or unsaturated polybasic acid anhydride mentioned above, thereby inducing introduction of the carboxylic group into the side chain of the resin.

As concrete examples of the polyfunctional epoxy compound (h) mentioned above, any epoxy resins may be used. As the typical examples thereof, bisphenol A type, hydrogenated bisphenol A type, bisphenol F type, bisphenol S type, phenol novolak type, cresol novolak type, bisphenol A novolak type, biphenol type, bixylenol type, N-glycidyl type, and other well known and widely used epoxy compounds may be cited. As commercially available, preferred substances, EHPE-3150 produced by Daicel Chemical Industries, Ltd., etc. may be cited. Further, the polyfunctional bisphenol type epoxy resin obtained by reacting the hydroxyl group of a solid bisphenol type epoxy resin with epihalohydrin such as epichlorohydrin so as to be polyfunctional may be cited. Among other epoxy compounds, particularly the use of phenol novolak type epoxy resin, cresol novolak type epoxy resin, and polyfunctional bisphenol type epoxy resin which have many epoxy groups and are in a solid state proves to be desirable. These polyfunctional epoxy compounds (h) may be used either singly or in the form of a combination of two or more members.

The reaction of the polyfunctional epoxy compound (h) and the unsaturated monocarboxylic acid (d) mentioned above is preferred to be effected in such a proportion that the ratio of equivalent weight of the epoxy group/equivalent weight of the carboxyl group falls in the range of 0.8 to 1.2, preferably 0.9 to 1.05. If the ratio of equivalent weight of the epoxy group/equivalent weight of the carboxyl group is less than 0.8, the problem of smell will arise due to the remaining unsaturated monocarboxylic acid. Conversely, if the equivalent ratio mentioned above exceeds 1.2, a large amount of epoxy group will remain, which will cause the undesired gelation during the subsequent reaction with the saturated or unsaturated polybasic acid anhydride (e). The reaction ratio of the saturated or unsaturated polybasic acid anhydride (e) to the resultant secondary hydroxyl group is adjusted such that the acid value of the resin obtained in the final stage falls in the preferred range of 45 to 160 mg KOH/g. In general, the equivalent weight of the acid anhydride group per one equivalent weight of the hydroxyl group caused by the reaction of the polyfunctional epoxy compound (h) and the unsaturated monocarboxylic acid (d) is in the range of 0.3 to 0.9, preferably in the range of 0.5 to 0.7.

The hydroxyl group-containing and carboxyl group-containing resin (6) mentioned above is a resin obtained by causing (e) the saturated or unsaturated polybasic acid anhydride to react with (i) a hydroxyl group-containing polymer and then causing a compound having an epoxy group and an unsaturated double bond to react with the part of the resultant carboxyl groups caused by the above reaction, thereby inducing introduction of the photosensitive group into the resin. As the hydroxyl group-containing polymer (i), polyvinyl acetals, cellulose, etc. may be used. By adjusting the reacting weight of the saturated or unsaturated polybasic acid anhydride (e), it is possible to use water as a diluent of the composition and also to use water as a developing solution besides a dilute aqueous alkaline solution.

The reaction for the synthesis of the carboxyl group-containing resin (7) mentioned above is attained by the first method which comprises causing the aforementioned unsaturated monocarboxylic acid (d) [or a compound (j) containing in its molecule at least one alcoholic hydroxyl group and one reactive group other than the alcoholic hydroxyl group, which can react with an epoxy group] to react with the aforementioned polyfunctional epoxy compound (h), then causing the compound (j) containing in its molecule at least one alcoholic hydroxyl group and one reactive group other than the alcoholic hydroxyl group, which can react with an epoxy group [or the unsaturated monocarboxylic acid (d)] to react with the resultant reaction product, and further causing the saturated or unsaturated polybasic acid anhydride (e) to react with the reaction product or by the second method which comprises causing simultaneous reaction of the polyfunctional epoxy compound (g), the unsaturated monocarboxylic acid (h), and the compound (j) containing in its molecule at least one alcoholic hydroxyl group and one reactive group other than the alcoholic hydroxyl group, which can react with an epoxy group, and further causing the saturated or unsaturated polybasic acid anhydride (e) to react with the reaction product. Though these two methods are both available, the second method proves to be desirable.

As concrete examples of the aforementioned compound (j) containing in its molecule at least one alcoholic hydroxyl group and one reactive group (such as, for example, a carboxyl group, a phenolic hydroxyl group, or secondary amino group) other than the alcoholic hydroxyl group, which can react with an epoxy group, for example, hydroxymonocarboxylic acids such as glycolic acid, dimethylol propionic acid, dimethylol acetic acid, dimethylol butyric acid, dimethylol valeric acid, and dimethylol caproic acid; alcoholic hydroxyl group-containing phenols such as (bis)hydroxymethyl phenol, (bis)hydroxymethyl cresol, p-hydroxyphenyl-2-methanol, p-hydroxyphenyl-3-propanol, and p-hydroxyphenetyl alcohol; dialkanol amines such as diethanol amine and diisopropanol amine, etc. may be cited.

The carboxyl group-containing photosensitive resin (8) mentioned above uses (l) a polyfunctional oxetane compound instead of the polyfunctional epoxy resin (h) which is a starting raw material of the carboxyl group-containing photosensitive resin (5) mentioned above.

That is, it is the carboxyl group-containing photosensitive resin obtained by causing the unsaturated monocarboxylic acid (d) to react with the polyfunctional oxetane compound (l) and then causing the saturated or unsaturated polybasic acid anhydride (d) to preponderantly react with the primary hydroxyl group of the resultant modified oxetane resin. This resin excels in thermal stability because the bonded site between the primary hydroxyl group and the acid anhydride may be thermally broken only with difficulty. By the use of this carboxyl group-containing photosensitive resin, it is possible to prepare an alkali-developing type photocurable and thermosetting resin composition which excels in heat resistance and thermal stability.

Next, as the photopolymerization initiator (B) having the oxime linkage represented by the aforementioned general formula (I), any of the well-known and widely used oxime-based photopolymerization initiator such as an o-acyl oxime ester compound, an oxime sulfonate compound, and a ketoxime ether compound may be used. Preferably, the oxime-based photopolymerization initiator represented by the following general formula (II) and having either skeleton of a xanthone skeleton, a thioxanthone skeleton, or an anthraquinone skeleton may be cited.

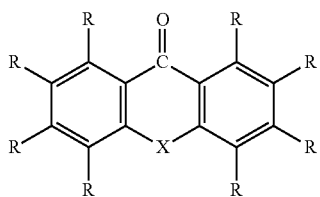

(II)

wherein one or two of R is a group represented by the following formula (III) and the remainder is a hydrogen atom, a halogen atom, a methyl group, or a phenyl group, and X represents an oxygen atom, a sulfur atom, or a carbonyl group.

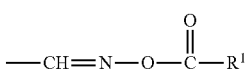

(III)

wherein $R^1$ represents a hydrogen atom, a methyl group, a phenyl group, a biphenyl group, or a phenyl group or biphenyl group severally substituted by an alkyl group of 1-6 carbon atoms.

As the particularly preferred initiator among these compounds, the oxime-based photopolymerization initiator represented by the following general formula (IV) and having the thioxanthone skeleton may be cited.

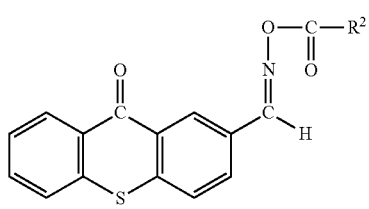

(IV)

wherein $R^2$ represents a methyl group or an ethyl group.

Since the oxime-based photopolymerization initiator (B) mentioned above has a pair of unpaired electrons in its nitrogen atom and exhibits high sensitivity, it is preferable that it should be incorporated into a formulation which is different from a formulation into which the above-mentioned carboxyl group-containing resin (A) and the above-mentioned reactive diluent (C) are incorporated to formulate a system comprising at least two parts in view of the stability of properties and the storage stability.

Specifically, when the above-mentioned oxime-based photopolymerization initiator (B) is mixed with an acid group-containing compound such as the aforementioned carboxyl group-containing resin (A) and the resultant mixture is left standing, the photosensitivity of the composition will significantly decrease or the composition will fail to be photosensitized and cause gelation due to the generation of radicals, which will result in the deterioration of various properties. In order to prevent such deterioration and attain stability of properties, it is important that the oxime-based photopolymerization initiator (B) should be incorporated into a formulation which is different from a formulation into which the above-mentioned carboxyl group-containing resin (A) is incorporated. Similarly, it is preferable in view of the storage stability that the oxime-based photopolymerization initiator should be incorporated into a formulation which is different from a formulation into which the above-mentioned carboxyl group-containing resin (A) and the above-mentioned reactive diluent (C) both having a reactive functional group are incorporated before their use and these formulations should be mixed at the time of use. Accordingly, when the photocurable and thermosetting resin composition is formulated to a two-part system consisting of formulations "A" and "B", for example, if the above-mentioned carboxyl group-containing resin (A) is incorporated into the formulation "A", it is then preferable that the oxime-based photopolymerization initiator (B) should be incorporated into the formulation "B" and the above-mentioned reactive diluent (C) should be incorporated into the formulation "A".

These oxime-based photopolymerization initiators (B) may be used either singly or in the form of a combination of two or more members. The amount of the aforementioned oxime-based photopolymerization initiator (B) to be used generally falls in the range of 0.01 to 20 parts by weight, preferably 0.1 to 10 parts by weight, based on 100 parts by weight of the aforementioned carboxyl group-containing resin (A).

Further, when the alkali-developing type photocurable and thermosetting resin composition containing the oxime-based photopolymerization initiator (B) as mentioned above is used on a copper foil, there is a possibility of producing copper ions, which are a strong Lewis acid, on the interface between the composition and the copper foil due to the presence of a carbooxyl group and a water content. Since such a Lewis acid may decompose the oxime-based photopolymerization initiator (B) mentioned above and may cause an undercut of a coating film after the exposure and development, it is preferred that other photopolymerization initiator (B-I) and/or sensitizer (B-II) be used in combination with the oxime-based photopolymerization initiator.

The other photopolymerization initiator (B-I) which may be used in combination with the aforementioned oxime-based photopolymerization initiator (B) in the composition of the present invention is a radical photopolymerization initiator of the benzophenone type, acetophenone type, benzoin ether type, ketal type, acyl phosphine oxide, peroxide type, titanothene type, etc. As concrete examples of the other photopolymerization initiator (B-I), for example, benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropan-1-one and 2-benzyl-2-dimethylamino-1-(4-morpholinophenyl)-butanone-1; anthraquinones such as 2-methylanthraquinone, 2-ethylanthraquinone, 2-t-butyl-anthraquinone, and 1-chloroanthraquinone; thioxanthones such as 2,4-dimethylthioxanthone, 2,4-diethylthioxanthone, 2-chloro-thioxanthone, 2-isopropylthioxanthone, and 4-isopropylthioxanthone; ketals such as acetophenone dimethyl ketal and benzyl dimethyl ketal; benzophenones such as benzophenone; or xanthones; acyl phosphine oxides such as (2,6-dimethoxybenzoyl)-2,4,4-pentyl phosphine oxide, bis(2,4,6-trimethylbenzoyl)-phenyl phosphine oxide, 2,4,6-trimethylbenzoyl-diphenyl phosphine oxide, and ethyl-2,4,6-trimethylbenzoyl-phenyl phosphinate; various peroxides, etc. may be cited. These well-known and widely used photopolymerization initiators may be used either singly or in the form of a combination of two or more members. The amount of the photopolymerization initiator (B-I) to be incorporated into the composition is preferred to be in the range of 0.1 to 10 parts by weight, based on 100 parts by weight of the aforementioned carboxyl group-containing resin (A).

As the sensitizer (B-II) to be used in combination with the photopolymerization initiator (B and B-I) mentioned above, tertiary amines like ethyl N,N-(dimethylamino)benzoate, isoamyl N,N-(dimethylamino)benzoate, pentyl-4-dimethylaminobenzoate, triethylamine, triethanolamine, etc. may be cited. These sensitizers may be used either singly or in the form of a combination of two or more members.

Further, such a titanothene type photopolymerization initiator as the product of Ciba Specialty Chemicals K.K., Irgacure 784, which initiates radical polymerization in a visible region, a leuco-dye, etc. may be optionally used as a curing aid in combination with the above photopolymerization initiator.

The reactive diluent (C) to be used in the photocurable and thermosetting resin composition of the present invention is used for the purpose of adjusting the viscosity of the composition thereby improving the workability thereof and increasing the crosslink density thereby obtaining a coating film possessed of adhesiveness etc. As such a reactive diluent (C), any compounds having at least one unsaturated double bond in its molecule, for example, alkyl (meth)acrylates such as 2-ethylhexyl (meth)acrylate and cyclohexyl (meth)acrylate; hydroxyalkyl (meth)acrylates such as 2-hydroxyethyl (meth)acrylate and 2-hydroxypropyl (meth)acrylate; mono- or di-(meth)acrylates of alkylene oxide derivatives such as ethylene glycol, propylene glycol, diethylene glycol, and dipropylene glycol; polyfunctional (meth)acrylates of polyhydric alcohols such as hexane diol, trimethylol propane, pentaerythritol, ditrimethylol propane, dipentaerythritol, and tris-hydroxyethyl isocyanurate, and ethylene oxide adducts or propylene oxide adducts of these polyhydric alcohols; (meth)acrylates of ethylene oxide adducts or propylene oxide adducts of phenols such as phenoxyethyl (meth)acrylate and polyethoxy di(meth)acrylate of bisphenol A; (meth)acrylates of glycidyl ethers such as glycerin diglycidyl ether, trimethylol propane triglycidyl ether, and triglycidyl isocyanurate; melamine (meth)acrylate, etc. may be cited. Among these compounds, a liquid reactive diluent proves to be desirable from the viewpoint of reactivity and diluting ability.

Further, a compound having an unsaturated double bond and also a carboxyl group in its molecule may be used as the reactive diluent (C). As such compounds, the reaction products of a saturated or unsaturated dibasic acid anhydride with a (meth)acrylate having one hydroxyl group in its molecule, for example, half esters obtained by causing a saturated or unsaturated dibasic acid anhydride, such as succinic anhydride, maleic anhydride, phthalic anhydride, tetrahydrophtalic anhydride, hexahydrophthalic anhydride, methylhexahydrophthalic anhydride, methyltetrahydrophthalic anhydride, itaconic anhydride, and methylendomethylene tetrahydrophthalic anhydride, to react in an equimolar ratio with a (meth)acrylate having one hydroxyl group in its molecule, such as hydroxyethyl (meth)acrylate, hydroxypropyl (meth)acrylate, hydroxybutyl (meth)acrylate, polyethylene glycol mono(meth)acrylate, glycerin di(meth)acrylate, trimethylol propane di(meth)acrylate, pentaerythritol tri(meth)acrylate, dipentaerythritol penta(meth)acrylate, and (meth)acrylate of phenyl glycidyl ether, may be used.

These reactive diluents (C) may be used either singly or in the form of a combination of two or more members. The preferred amount thereof to be used is in the range of 2 to 50 parts by weight, based on 100 parts by weight of the carboxyl group-containing resin (A) mentioned above. If the amount of the reactive diluent (C) is less than the lower limit of the above range, the shortage will tend to induce insufficient curing and reduced sensitivity of a coating film. Conversely, if the amount is unduly large so as to exceed the above range, the composition will be at a disadvantage in reducing the tack-free dryness of a coating film and render the cured coating film brittle.

Though the photocurable and thermosetting resin composition of the present invention does not always require to use an organic solvent because it uses the reactive diluent (C) mentioned above, it may incorporate an organic solvent for the purpose of adjusting the viscosity of itself or for dissolving the aforementioned carboxyl group-containing resin therein to prepare a varnish. As the organic solvent, a solvent which makes the composition to be easily dried and exhibits low toxicity is selected. For example, alcohols such as methanol, ethanol, propyl alcohol, isopropyl alcohol, butanol, and isobutanol; acetates such as ethyl acetate, butyl acetate, amyl acetate, cyclohexyl acetate, methyl acetoacetate, dimethyl adipate, dimethyl glutamate, and dimethyl succinate; ketones such as cyclohexanone, methyl cyclohexanone, 2-butanone, methyl isobutyl ketone, and acetone; alkylene oxide derivatives such as ethylene glycol monomethyl ether acetate, ethylene glycol monoethyl ether acetate, ethylene glycol monobutyl ether acetate, ethylene glycol monomethyl ether, ethylene glycol monoethyl ether, ethylene glycol monobutyl ether, ethylene glycol dimethyl ether, ethylene glycol diethyl ether, ethylene glycol dibutyl ether, diethylene glycol monomethyl ether acetate, diethylene glycol monoethyl ether acetate, diethylene glycol monobutyl ether acetate, diethylene glycol monomethyl ether, diethylene glycol monoethyl ether, diethylene glycol monobutyl ether, diethylene glycol dimethyl ether, diethylene glycol diethyl ether, diethylene glycol dibutyl ether, propylene glycol monomethyl ether acetate, propylene glycol monomethyl ether, propylene glycol monobutyl ether, dipropylene glycol monomethyl ether acetate, and dipropylene glycol monomethyl ether; toluene, mineral spirit, etc. may be suitably used. These organic solvents may be used either singly or in the form of a mixture of two or more members.

As the aforementioned epoxy compound (D) having two or more epoxy groups in its molecule, any polyfunctional epoxy compounds which have been heretofore known in the art may be used. For example, any epoxy compounds having two or more epoxy groups in its molecule such as bisphenol A type epoxy resins represented by EPIKOTE 828, EPIKOTE 834, EPIKOTE 1001, and EPIKOTE 1004 produced by Japan Epoxy Resin K.K., EPICLON 840, EPICLON 850, EPICLON 1050, and EPICLON 2055 produced by Dainippon Ink and Chemicals Inc., Epo Tohto YD-011, YD-013, YD-127, and YD-128 produced by Tohto Kasei Co., Ltd., and Sumi-epoxy ESA-011, ESA-014, ELA-115, and ELA-128 produced by Sumitomo Chemical Co., Ltd. (all trade names); brominated epoxy resins represented by EPIKOTE YL903 produced by Japan Epoxy Resin K.K., EPICLON 152 and EPICLON 165 produced by Dainippon Ink and Chemicals Inc., Epo Tohto YDB-400 and YDB-500 produced by Tohto Kasei Co., Ltd., and Sumi-epoxy ESB-400 and ESB-700 produced by Sumitomo Chemical Co., Ltd. (all trade names); novolak type epoxy resins represented by EPIKOTE 152 and EPIKOTE 154 produced by Japan Epoxy Resin K.K., EPICLON N-730, EPICLON N-770, and EPICLON N-865 produced by Dainippon Ink and Chemicals Inc., Epo Tohto YDCN-701 and YDCN-704 produced by Tohto Kasei Co., Ltd., EPPN-201, EOCN-1025, EOCN-1020, EOCN-1045, and RE-306 produced by Nippon Kayaku Co., Ltd., and Sumi-epoxy ESCN-195X and ESCN-220 produced by Sumitomo Chemical Co., Ltd. (all trade names); bisphenol F type epoxy resins represented by EPICLON 830 produced by Dainippon Ink and Chemicals Inc., EPIKOTE 807 produced by Japan Epoxy Resin K.K., and Epo Tohto YDF-170, YDF-175, and YDF-2004 produced by Tohto Kasei Co., Ltd. (all trade names); hydrogenated bisphenol A type epoxy resins represented by Epo Tohto ST-2004, ST-2007, and ST-3000 produced by Tohto Kasei Co., Ltd. (all trade names); glycidylamine type epoxy resins represented by EPIKOTE 604 produced by Japan Epoxy Resin K.K., Epo Tohto YH-434 produced by Tohto Kasei Co., Ltd., and Sumi-epoxy ELM-120 produced by Sumitomo Chemical Co., Ltd. (all trade names); alicyclic epoxy resins represented by Celloxide 2021 (trade name) produced by Daicel Chemical Industries, Ltd.; trihydroxyphenyl methane type epoxy resins represented by YL-933 produced by Japan Epoxy Resin K.K. and EPPN-501 and EPPN-502 produced by Nippon Kayaku Co., Ltd. (all trade names); bixylenol type or biphenol type epoxy resins or mixtures thereof represented by YL-6056, YX-4000, and YL-6121 produced by Japan Epoxy Resin K.K. (all trade names); bisphenol S type epoxy resins represented by EBPS-200 produced by Nippon Kayaku Co., Ltd., EPX-30 produced by Asahi Denka Kogyo K.K., and EXA-1514 produced by Dainippon Ink and Chemicals Inc. (all trade names); bisphenol A novolak type epoxy resins represented by EP IKOTE 157S (trade name) produced by Japan Epoxy Resin K.K.; tetraphenylol ethane type epoxy resins represented by EPIKOTE YL-931 (trade name) produced by Japan Epoxy Resin K.K.; heterocyclic epoxy resins represented by TEPIC (trade name) produced by Nissan Chemical Industries Ltd.; diglycidyl phthalate resin represented by BLEMMER DGT (trade name) produced by Nippon Oil and Fats Co., Ltd.; tetraglycidyl xylenoyl ethane resins represented by ZX-1063 (trade name) produced by Tohto Kasei Co., Ltd.; naphthalene group-containing epoxy resins represented by ESN-190 and ESN-360 produced by Shinnittetsu Chemical Co., Ltd. and HP-4032, EXA-4750, and EXA-4700 produced by Dainippon Ink and Chemicals Inc. (all trade names); dicyclopentadiene skeleton-containing epoxy resins represented by HP-7200 and HP-7200H produced by Dainippon Ink and Chemicals Inc. (all trade names); glycidyl methacrylate copolymer type epoxy resins represented by CP-50S and CP-50M produced by Nippon Oil and Fats Co., Ltd. (all trade names); copolymeric epoxy resin of cyclohexylmaleimide and glycidyl methacrylate, etc. may be cited. These epoxy compounds may be used either singly or in the form of a combination of two or more members. The amount of the aforementioned polyfunctional epoxy compound (D) to be incorporated in the composition as a thermosetting component is desired to be in such a ratio that the epoxy group is in the range of 0.6 to 2.0 equivalent weights, preferably 0.8 to 1.6 equivalent weights per one equivalent weight of the carboxyl group of the aforementioned carboxyl group-containing resin (A). The ratio of the epoxy group less than 0.6 equivalent weight is not preferred because the carboxyl groups will remain and the resistance to alkalis and electrical insulating properties of a coating film will be degraded. Conversely, the ratio of the epoxy group exceeding 2.0 equivalent weights is not preferred because the excess epoxy resin functions as a plasticizing agent and, as a result, the strength of a coating film will be degraded.

Further, as an accelerator for the reaction of the polyfunctional epoxy compound (D) mentioned above with the aforementioned carboxyl group-containing resin (A), a well-known epoxy curing promotorsuch as amines, dicyandiamide, urea derivatives, melamine, S-triazine compounds, guanamine compounds, and imidazole compounds such as 2-ethyl-4-methylimidazole may be used in combination therewith. By effecting the thermal curing of the above components in the presence of the above-mentioned accelerator, it is possible to improve various properties of a cured coating film such as heat resistance, resistance to chemicals, adhesiveness, and pencil hardness.

The photocurable and thermosetting resin composition of the present invention may further incorporate therein an inorganic filler and/or an organic filler (E) for the purpose of improving the properties thereof. As the inorganic filler, any well-known and widely used inorganic fillers such as barium sulfate, barium titanate, finely powdered silicon oxide, amorphous silica, crystalline silica, fused silica, talc, clay, magnesium carbonate, calcium carbonate, aluminum oxide, aluminum hydroxide, and mica power may be used. The amount of the inorganic filler to be used is desired to be in the ratio of 0 to 60% by weight, more preferably 5 to 40% by weight of the composition of the present invention.

As the organic filler, any particles of a macromolecular compound such as an epoxy-based, rubber-based, acryl-based, urethane-based, polyimide-based, or polyamide-based macromolecular compound may be used. The particle size thereof is preferred to be not more than 10 μm. The organic filler may be incorporated in the composition of the present invention in the ratio of 0 to 30% by weight of the composition.

The photocurable and thermosetting resin composition of the present invention may further incorporate therein, when necessary, a well-known and widely used additive such as a well-known and widely used coloring pigment like phthalocyanine blue, phthalocyanine green, Iodine Green, disazo yellow, crystal violet, titanium dioxide, carbon black, and naphthalene black; a well-known and widely used polymerization inhibitor like hydroquinone, hydroquinone monomethyl ether, t-butyl catechol, pyrogallol, and phenothiazine; a well-known and widely used thickening agent like asbestos, organic bentonite, benton, and montomorillonite; an anti-foaming agent and/or leveling agent of a silicone type, a fluorine type, and a macromolecular type; an adhesiveness-imparting agent of a imidazole type, a triazole type, a triazole type, and a silane coupling agent, or the like.

By using the photocurable and thermosetting resin composition containing the aforementioned components in the way as mentioned below, it is possible to provide a printed circuit board having a solder resist layer and/or a resin insulating layer formed thereon.

The photocurable and thermosetting resin composition of the present invention is adjusted, when necessary, to a level of viscosity suitable for a particular coating method, for example, applied to a substrate by a dip coating method, a flow coating method, a roll coating method, a bar coater method, a screen printing method, a curtain coating method, or the like, and then dried at a temperature in the approximate range of 60 to 100° C. to expel by evaporation the organic solvent contained in the composition (preliminary drying) to produce a tack-free coating film. Further, a resin insulating layer may be formed by applying the composition mentioned above to a plastic film, drying the composition, winding the film, and then laminating the coating film on a substrate. Thereafter, the coating film is selectively exposed to an actinic ray through a photomask having a prescribed pattern by a contact method (or non-contact method) and the unexposed area of the coating film is developed with a dilute aqueous alkaline solution (such as, for example, an aqueous solution of about 0.3 to 3% sodium carbonate) to form a resist pattern. Further, the photo-cured coating film may be thermally cured by heating to a temperature in the approximate range of 140 to 180° C., for example. Since the reaction of the carboxyl group of the aforementioned carboxyl group-containing resin (A) with the epoxy group of the aforementioned epoxy compound (D) having two or more epoxy groups in its molecule takes place in this thermal treatment, it is possible to form a cured coating film which excels in various properties such as resistance to heat, resistance to solvents, resistance to acids, resistance to moisture absorption, PCT resistance, adhesiveness, and electrical properties.

The light sources which are properly used for the purpose of photo-curing the composition include a low-pressure mercury lamp, a medium-pressure mercury lamp, a high-pressure mercury lamp, an ultra-high-pressure mercury lamp, a xenon lamp, and a metal halide lamp. Further, the laser source may also be utilized as the actinic ray for exposure of the film in the direct imaging technique to directly form the image.

As a dilute aqueous alkaline solution to be used in the process of development mentioned above, aqueous alkaline solutions of potassium hydroxide, sodium hydroxide, sodium carbonate, potassium carbonate, sodium silicate, ammonia, amines, etc. may be used. Among other aqueous alkaline solutions, sodium carbonate proves to be particularly preferable.

Now, the present invention will be described more specifically below with reference to a synthesis example, working examples, and comparative examples. As a matter of course, the following Examples are in any sense restrictive of the present invention. Wherever the terms "parts" and "%" are used hereinbelow, they shall refer to "parts by weight" and "% by weight" unless otherwise specified.

SYNTHESIS EXAMPLE 1

Synthesis of Carboxyl Group-Containing Photosensitive Resin

Into a three-necked flask equipped with a thermometer, a stirrer, a dropping funnel, and a reflux condenser, 217 g (1.0 equivalent weight) of cresol novolak type epoxy resin of which epoxy equivalent is 217 and which contains seven phenol skeleton residues in average per one molecule and also epoxy groups and 204.8 g of carbitol acetate were charged and they were molten by heating. To this mixture, 0.2 g of hydroquinone as a polymerization inhibitor and 1.0 g of triphenyl phosphine as a catalyst were added. To the resultant mixture, 72.0 g (1.0 equivalent weight) of acrylic acid was gradually added and they were left reacting for 16 hours at 85-105° C. To the resultant reaction product, 91.2 g (0.67 equivalent weight) of tetrahydrophthalic anhydride was further added to effect the addition reaction. The varnish obtained as described above was a viscous liquid containing 35 parts of carbitol acetate and confirmed to be a carboxyl group-containing photosensitive resin having an acid value of 65 mg KOH/g as a mixture.

EXAMPLE 1

A Composition Containing the Component (B) Added to a Formulation Separated from that Containing the Components (A) and (C)

A composition was prepared by compounding 100 parts of the carboxyl group-containing photosensitive resin as the component (A) obtained in Synthesis Example 1 with 10 parts of dipentaerythritol hexaacrylate as the component (C), 1 part of an anti-foaming agent (AC-300 produced by Kyoeisha Chemical Co., Ltd.), 80 parts of barium sulfate, and 0.5 part of phthalocyanine green and then mixing and dispersing the resultant mixture with a three-roll mill. This composition is hereinafter referred to as liquid "A". Another composition was prepared by compounding 5 parts of the photopolymerization initiator as the component (B) having the oxime linkage and represented by the aforementioned formula (IV) wherein $R^2$ is methyl group with 1 part of diethyl thioxanthone (Kayacure DETX-S produced by Nippon Kayaku Co., Ltd.) as the component (B-I), 2.5 parts of ethyl 4-dimethylaminobenzoate (Kayacure EPA produced by Nippon Kayaku Co., Ltd.) as the component (B-II), and 20 parts of cresol novolak type epoxy resin (EOCN 1020 produced by Nippon Kayaku Co., Ltd.) and 10 parts of bisphenol A type epoxy resin (EPIKOTE 828 produced by Japan Epoxy Resin K.K.) both as the component (D) and then mixing and dispersing the resultant mixture with a three-roll mill. This composition is hereinafter referred to as liquid "B". In this way, the liquid "A" and the liquid "B" of a photocurable and thermosetting resin composition were prepared.

EXAMPLE 2

A Composition Containing the Component B Added to a Formulation Separated from that Containing the Components A and C The liquid "A" and the liquid "B" of a photocurable and thermosetting resin composition were prepared under the conditions of the same formulations and the same procedures as used in Example 1 except that diethyl thioxanthone as the component (B-I) and ethyl 4-dimethylaminobenzoate as the component (B-II) were not used.

COMPARATIVE EXAMPLE 1

A Composition Including a Formulation to which the Component B was Added Together with the Component A A composition was prepared by compounding 100 parts of the carboxyl group-containing photosensitive resin as the component (A) obtained in Synthesis Example 1 with 5 parts of the photopolymerization initiator as the component (B) having the oxime linkage and represented by the aforementioned formula (IV) wherein $R^2$ is methyl group, 1 part of diethyl thioxanthone (Kayacure DETX-S produced by Nippon Kayaku Co., Ltd.) as the component (B-I), 2.5 parts of ethyl 4-dimethylaminobenzoate (Kayacure EPA produced by Nippon Kayaku Co., Ltd.) as the component (B-II), 1 part of an anti-foaming agent (AC-300 produced by Kyoeisha Chemical Co., Ltd.), 80 parts of barium sulfate, and 0.5 part of phthalocyanine green and then mixing and dispersing the resultant mixture with a three-roll mill. This composition is hereinafter referred to as liquid "A". Another composition was prepared by compounding 10 parts of dipentaerythritol hexaacrylate as the component (C) with 20 parts of cresol novolak type epoxy resin (EOCN 1020 produced by Nippon Kayaku Co., Ltd.) and 10 parts of bisphenol A type epoxy resin (EPIKOTE 828 produced by Japan Epoxy Resin K.K.) both as the component (D) and then mixing and dispersing the resultant mixture with a three-roll mill. This composition is hereinafter referred to as liquid "B". In this way, the liquid "A" and the liquid "B" of a photocurable and thermosetting resin composition were prepared.

COMPARATIVE EXAMPLE 2

A Composition to which the Component B was Added Together with the Component A and the Component C A photocurable and thermosetting resin composition of one-pack type was prepared by compounding 100 parts of the carboxyl group-containing photosensitive resin as the component (A) obtained in Synthesis Example 1 with 5 parts of the photopolymerization initiator as the component (B) having the oxime linkage and represented by the aforementioned formula (IV) wherein $R^2$ is methyl group, 1 part of diethyl thioxanthone (Kayacure DETX-S produced by Nippon Kayaku Co., Ltd.) as the component (B-I), 2.5 parts of ethyl 4-dimethylaminobenzoate (Kayacure EPA produced by Nippon Kayaku Co., Ltd.) as the component (B-II), 1 part of an anti-foaming agent (AC-300 produced by Kyoeisha Chemical Co., Ltd.), 80 parts of barium sulfate, 0.5 part of phthalocyanine green, 10 parts of dipentaerythritol hexaacrylate as the component (C), 20 parts of cresol novolak type epoxy resin (EOCN 1020 produced by Nippon Kayaku Co., Ltd.) and 10 parts of bisphenol A type epoxy resin (EPIKOTE 828 produced by Japan Epoxy Resin K.K.) both as the component (D) and then mixing and dispersing the resultant mixture with a three-roll mill.

COMPARATIVE EXAMPLE 3

A Composition Using an Initiator Other than the Oxime-Based Photopolymerization Initiator The liquid "A" and the liquid "B" of a photocurable and thermosetting resin composition were prepared under the conditions of the same formulations and the same procedures as used in Comparative Example 1 except that 5 parts of 2-methyl-1-[4-(methylthio)phenyl]-2-morpholinopropan-1-one (Irgacure 907 produced by Ciba Specialty Chemicals K.K.) was used instead of 5 parts of the photopolymerization initiator as the component (B) having the oxime linkage and represented by the aforementioned formula (IV) wherein $R^2$ is methyl group.

The photocurable and thermosetting resin compositions obtained in Examples 1, 2 and Comparative Examples 1-3 were kept in a thermostatic chamber at 20° C. or 50° C. for three days. Thereafter, with respect to the photocurable and thermosetting resin compositions obtained in Examples 1, 2 and Comparative Examples 1, 3, the liquid "A" and the liquid "B" of respective compositions were thoroughly mixed.

After storage under the conditions mentioned above, each of the photocurable and thermosetting resin compositions of Examples 1, 2 and Comparative Examples 1-3 was applied by the screen printing method to the entire surface of a copper-clad laminate of a glass-epoxy substrate laminated with a copper foil (35 μm thickness) and to the entire surface of a printed circuit board prepared from this copper-clad laminate and having a prescribed pattern formed in advance by etching. Thereafter, the coating film was dried in a hot air circulating drying oven, irradiated with ultraviolet light at a dose of 300 mJ/cm² through a prescribed negative film tightly superposed on the coating film, then developed for 60 seconds with an aqueous 1.0 wt. % sodium carbonate solution, and thermally cured in a hot air circulating drying oven at 150° C. for 60 minutes to obtain a cured coating film. With respect to the properties of each of the resultant cured coating films, the results of respective Examples are shown in Table 1 and those of respective Comparative Examples are shown in Table 2. The properties of each cured coating film were evaluated by the following methods.

(1) Developability:
Each coating film which had undergone the preliminary drying was developed without subjecting to the exposure to evaluate the presence or absence of undeveloped residue.
○: Developable
X: Undevelopable (2) Sensitivity:
A step tablet, Kodak No. 2 was placed on each coating film which had undergone the preliminary drying. The coating film was then exposed to light at a dose of 300 mJ/cm² by using an exposure device equipped with an ultra-high-pressure mercury lamp and then developed. Thereafter, the sensitivity was evaluated based on the number of steps obtained from the step tablet.
Numerical value: Number of steps obtained
X: A cured coating film was not obtained after development.

(3) Resolution:
Each coating film which had undergone the preliminary drying was exposed to light through a prescribed negative pattern of the line of 50-130 μm at a dose of 300 mJ/cm² by using an exposure device equipped with an ultra-high-pressure mercury lamp and then developed. Thereafter, the formed line of the smallest width was readout to evaluate the resolution characteristics.

(4) Adhesiveness:
In accordance with the testing method specified in JIS (Japanese Industrial Standard) D-0202, the cured coating film of each test piece was incised like cross-cut in the shape of squares in a go board to form 100 cut portions and then subjected to a peel test with a cellophane adhesive tape to visually examine the separated portions of the film.

[Unpeeled portions]/100

(5) Resistance to Soldering Heat:
In accordance with the testing method specified in JIS C-6481, a cycle of the test in which each test piece having the cured coating film was immersed for 10 seconds in a solder bath set in advance at 260° C. and then subjected to a peel test with a cellophane adhesive was repeated three times. After completion of the test of three cycles, the state of the coating film was evaluated.
○: Absence of any discernible change was found in the coating film even after three-cycle test.
X: Peeling of the coating film was found after three-cycle test.

(6) Resistance to Electroless Plating:
Each test piece was plated successively in an electroless nickel plating bath and an electroless gold plating bath, both available in the market, under the conditions of 0.5 μm of nickel and 0.03 μm of gold and then subjected to a peel test with a cellophane adhesive tape to determine whether or not the cured coating film was peeled and whether or not the cured coating film had been infiltrated with the plating medium.
○: Absolutely no peeling of the cured coating film observed.
Δ: Slight peeling of the cured coating film observed.
X: Peeling of the cured coating film observed.

(7) LDI (Laser Direct Imaging) Sensitivity:
A step tablet, Kodak No. 2 was tightly superposed on each coating film which had undergone the preliminary drying. The coating film was then exposed to light by using an exposure device equipped with a laser source capable of irradiating a multi-wavelength of 350 nm and 366 nm at such a dose that the accumulation dose of 350 nm reaches 60 mJ/cm² and then developed. Thereafter, the sensitivity was evaluated based on the number of steps obtained from the step tablet.
Numerical Value: Number of Steps Obtained
X: A cured coating film was not obtained after development.

TABLE 1

| | Example 1 | | | | Example 2 | | | |
|---|---|---|---|---|---|---|---|---|
| Conditions for left standing | 20° C., 3 days | | 50° C., 3 days | | 20° C., 3 days | | 50° C., 3 days | |
| Drying period (80° C.) | 30 min. | 60 min. | 30 min. | 60 min. | 30 min. | 60 min. | 30 min. | 60 min. |
| Developability | ○ | ○ | ○ | ○ | ○ | ○ | ○ | ○ |
| Sensitivity (step) | 10 | 10 | 10 | 10 | 9 | 9 | 9 | 8 |
| Resolution | 50 | 50 | 50 | 50 | 50 | 50 | 50 | 50 |
| Adhesiveness | 100/100 | 100/100 | 100/100 | 100/100 | 100/100 | 100/100 | 100/100 | 100/100 |
| Resistance to soldering heat | ○ | ○ | ○ | ○ | ○ | ○ | ○ | ○ |
| Resistance to electroless plating | ○ | ○ | ○ | ○ | ○ | ○ | ○ | ○ |
| LDI sensitivity | 6 | 6 | 6 | 6 | 6 | 6 | 6 | 5 |

TABLE 2

| | Comparative Example 1 | | | | Comparative Example 2 | | | | Comparative Example 3 | | | |
|---|---|---|---|---|---|---|---|---|---|---|---|---|
| Conditions for left standing | 20° C., 3 days | | 50° C., 3 days | | 20° C., 3 days | | 50° C., 3 days | | 20° C., 3 days | | 50° C., 3 days | |
| Drying period (80° C.) | 30 min. | 60 min. | 30 min. | 60 min. | 30 min. | 60 min. | 30 min. | 60 min. | 30 min. | 60 min. | 30 min. | 60 min. |
| Developability | ○ | ○ | ○ | ○ | ○ | ○ | X | X | ○ | ○ | ○ | ○ |
| Sensitivity (step) | 8 | 5 | 1 | X | 8 | X | — | — | 5 | 5 | 5 | 5 |
| Resolution | 50 | 50 | 50 | — | 80 | — | — | — | 100 | 100 | 100 | 100 |
| Adhesiveness | 100/100 | 100/100 | 60/100 | — | 100/100 | — | — | — | 100/100 | 100/100 | 100/100 | 100/100 |
| Resistance to soldering heat | ○ | ○ | X | — | ○ | — | — | — | ○ | ○ | ○ | ○ |
| Resistance to electroless plating | ○ | Δ | X | — | ○ | — | — | — | ○ | ○ | ○ | ○ |
| LDI sensitivity | 4 | 2 | X | X | 4 | X | — | — | 1 | 1 | 1 | 1 |

As being clear from the results shown in Tables 1 and 2, Comparative 1 including the formulation to which the component (B) was added together with the component (A) exhibited poor storage stability as compared with Examples 1 and 2. Further, Comparative 2 including the formulation to which the component (B) was added together with the component (A) and the component (C) exhibited more poor storage stability than that of Comparative Example 1. Incidentally, though Comparative Example 3 using the components (B-I) and (B-II) instead of the component (B) as a photopolymerization initiator had no problem in storage stability but was inferior in sensitivity and resolution.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

The photocurable and thermosetting resin composition according to the present invention is useful in the formation of solder resist layers and/or resin insulating layers of printed circuit boards or multi-layer printed circuit boards. Further, it may be used in the laser direct imaging technique.

The International Application PCT/JP03/15187, filed Nov. 27, 2003, describes the invention described hereinabove and claimed in the claims appended hereinbelow, the disclosure of which is incorporated here by reference.

What is claimed is:

1. A method of storing a photocurable and thermosetting resin composition for forming a solder resist, the method comprising the steps of:
 preparing a multi-part system comprising at least a first composition and a second composition, the first composition including (A) a carboxyl group-containing resin and (C) a reactive diluent, the carboxyl group-containing resin (A) having at least one carboxyl group in its molecule, and the second composition including (D) an epoxy compound having two or more epoxy groups in its molecule, and the multi-part system being prepared to further comprise (B) a photopolymerization initiator having an oxime linkage represented by the following general formula (I), said photopolymerization initiator (B) being included in a composition which is different from the first composition, and

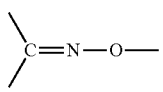

storing the first composition separately from the photopolymerization initiator (B).

2. The method according to claim 1, wherein said carboxyl group-containing resin (A) is a carboxyl group-containing photosensitive resin having two or more photosensitive unsaturated double bonds in its molecule.

3. The method according to claim 1, wherein said photopolymerization initiator (B) having the oxime linkage represented by said general formula (I) is a compound represented by the following general formula (II):

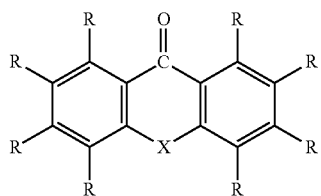

wherein one or two of R is a group represented by the following formula (III) and the remainder is a hydrogen atom, a halogen atom, a methyl group, or a phenyl group, and X represents an oxygen atom, a sulfur atom, or a carbonyl group,

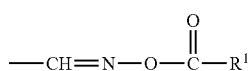

wherein $R^1$ represents a hydrogen atom, a methyl group, a phenyl group, a biphenyl group, or a phenyl group or biphenyl group severally substituted by an alkyl group of 1-6 carbon atoms.

4. The method according to claim 1, wherein in the step of preparing the multi-part system, another photopolymerization initiator (B-I) other than said photopolymerization initiator (B) and/or a sensitizer (B-II), are included in a third composition, the third composition being different from the first composition.

5. The method according to claim 1, wherein said reactive diluent (C) is a liquid photosensitive compound having at least one unsaturated double bond in its molecule and present in an amount of 2 to 50 parts by weight, based on 100 parts by weight of said carboxyl group-containing resin (A).

6. The method according to claim 1, wherein, in the step of preparing the multi part system, the multi-part system is prepared to further comprise an inorganic filler and/or an organic filler (E), wherein said inorganic filler and/or said organic filler (E) is included in either the first composition or the second composition.

7. The method according to claim 1, wherein said photopolymerization initiator (B) is a compound represented by the following general formula (IV):

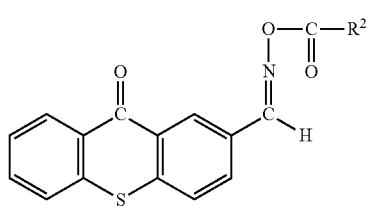

wherein $R^2$ represents a methyl group or an ethyl group.

8. A method of storing a solder-resist precursor, the method comprising the steps of:

preparing a multi-part system comprising a first composition including (A) a carboxyl group-containing resin and (C) a reactive diluent, the carboxyl group-containing resin (A) having at least one carboxyl group in its molecule and (C) a reactive diluent, and a second composition including (D) an epoxy compound having two or more epoxy groups in its molecule, the multi-part system being prepared to further comprise (B) a photopolymerization initiator having an oxime linkage represented by the following general formula (I), said photopolymerization initiator (B) being included in a composition which is different from the first composition, and storing the first composition separately from the photopolymerization initiator (B).

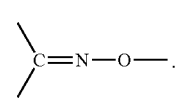

9. The method according to claim 8, wherein said carboxyl group-containing resin (A) is a carboxyl group-containing photosensitive resin having two or more photosensitive unsaturated double bonds in its molecule.

10. The method according to claim 8, wherein said photopolymerization initiator (B) having the oxime linkage represented by said general formula (I) is a compound represented by the following general formula (II):

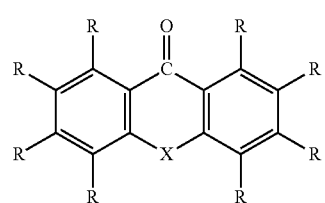

wherein one or two of R is a group represented by the following formula (III) and the remainder is a hydrogen atom, a halogen atom, a methyl group, or a phenyl group, and X represents an oxygen atom, a sulfur atom, or a carbonyl group, $$-CH=N-O-\overset{O}{\underset{\|}{C}}-R^1 \quad (III)$$

wherein $R^1$ represents a hydrogen atom, a methyl group, a phenyl group, a biphenyl group, or a phenyl group or biphenyl group severally substituted by an alkyl group of 1-6 carbon atoms.

11. The method according to claim 8, wherein, in the step of preparing the multi-part system, another photopolymerization initiator (B-I) other than said photopolymerization initiator (B) and/or a sensitizer (B-II), are included in a third composition, the third composition being different from the first composition.

12. The method according to claim 8, wherein said reactive diluent (C) is a liquid photosensitive compound having at least one unsaturated double bond in its molecule and present in an amount of 2 to 50 parts by weight, based on 100 parts by weight of said carboxyl group-containing resin (A).

13. The method according to claim 8, wherein, in the step of preparing the multi part system, the multi-part system is prepared to further comprise an inorganic filler and/or an organic filler (E), wherein said inorganic filler and/or said organic filler (E) being included in either the first composition or the second composition.

14. The method according to claim 8, wherein said photopolymerization initiator (B) is a compound represented by the following general formula (IV):

(IV)

[Structure of thioxanthone with oxime ester group, with $R^2$]

wherein $R^2$ represents a methyl group or an ethyl group.

15. The method according to claim 8, wherein the solder-resist precursor is configured to form a photocurable and thermosetting solder resist.

16. A solder-resist precursor composition comprising:
(A) a carboxyl group-containing resin having at least one carboxyl group in its molecule,
(B) a photopolymerization initiator having an oxime linkage represented by the following general formula (I), $$\overset{\diagdown}{\underset{\diagup}{C}}=N-O- \quad (I)$$

(C) a reactive diluent, and
(D) an epoxy compound having two or more epoxy groups in its molecule, wherein
said solder-resist precursor includes at least a first formulation and a second formulation, said photopolymerization initiator (B) is included in the first formulation and said carboxyl group-containing resin (A) and said reactive diluent (C) are included in the second formulation, and the first formulation is stored separately from the second formulation.

17. The solder-resist precursor composition according to claim 16, wherein said carboxyl group-containing resin (A) is a carboxyl group-containing photosensitive resin having two or more photosensitive unsaturated double bonds in its molecule.

18. The solder-resist precursor composition according to claim 16, wherein said photopolymerization initiator (B) having the oxime linkage represented by said general formula (I) is a compound represented by the following general formula (II):

(II)

[Structure with R substituents and X]

wherein one or two of R is a group represented by the following formula (III) and the remainder is a hydrogen atom, a halogen atom, a methyl group, or a phenyl group, and X represents an oxygen atom, a sulfur atom, or a carbonyl group, $$-CH=N-O-\overset{O}{\underset{\|}{C}}-R^1 \quad (III)$$

wherein $R^1$ represents a hydrogen atom, a methyl group, a phenyl group, a biphenyl group, or a phenyl group or biphenyl group severally substituted by an alkyl group of 1-6 carbon atoms.

19. The solder-resist precursor composition according to claim 16, further comprising another photopolymerization initiator (B-I) other than said photopolymerization initiator (B) and/or a sensitizer (B-II).

20. The solder-resist precursor composition according to claim 16, wherein said reactive diluent (C) is a liquid photosensitive compound having at least one unsaturated double bond in its molecule and present in an amount of 2 to 50 parts by weight, based on 100 parts by weight of said carboxyl group-containing resin (A).

21. The solder-resist precursor composition according to claim 16, further comprising an inorganic filler and/or an organic filler (E).

22. The solder-resist precursor composition according to claim 16, wherein said photopolymerization initiator (B) is a compound represented by the following general formula (IV):

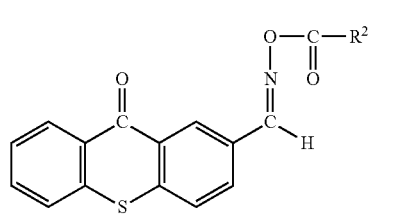 (IV)

wherein R² represents a methyl group or an ethyl group.

23. A printed circuit board having a solder resist layer and a resin insulating layer formed thereon by the use of the solder-resist precursor composition according to claim 16.

24. The solder-resist precursor composition according to claim 16, wherein the solder-resist precursor system is configured to form a photocurable and thermosetting solder resist.

* * * * *